United States Patent [19]

Kawashima

[11] Patent Number: 5,059,853
[45] Date of Patent: Oct. 22, 1991

[54] LONGITUDINAL QUARTZ CRYSTAL RESONATOR

[75] Inventor: Hirofumi Kawashima, Sendai, Japan

[73] Assignee: Seiko Electric Components Ltd., Japan

[21] Appl. No.: 554,172

[22] Filed: Jul. 13, 1990

Related U.S. Application Data

[63] Continuation of Ser. No. 199,540, May 27, 1988, abandoned.

[30] Foreign Application Priority Data

Jun. 2, 1987 [JP] Japan .............................. 62-138382

[51] Int. Cl.5 .............................................. H01L 41/08
[52] U.S. Cl. ...................................... 310/367; 310/361
[58] Field of Search .............................. 310/321–323, 310/367–370

[56] References Cited

FOREIGN PATENT DOCUMENTS

| | | | |
|---|---|---|---|
| 0037719 | 3/1984 | Japan | 310/367 |
| 0037722 | 3/1984 | Japan | 310/367 |
| 0218019 | 12/1984 | Japan | 310/367 |
| 0070810 | 4/1985 | Japan | 310/367 |

Primary Examiner—Mark O. Budd
Attorney, Agent, or Firm—Bruce L. Adams; Van C. Wilks

[57] ABSTRACT

A longitudinal quartz crystal resonator which creates an extremely small amount of vibrational leakage. Quartz is a highly stable material physically and chemically. A so-called quartz crystal resonator formed of quartz therefore has a low series resistance and a high Q-value. Such excellent characteristics are, however, obtained on the condition that the quartz crystal resonator is designed so as to produce a less leakage of vibration. Energy of a vibrational portion is trapped within itself by contriving and improving a configuration of a supporting portion of the longitudinal quartz crystal resonator which is incorporated with the vibrational portion and the supporting portion by an etching method.

2 Claims, 1 Drawing Sheet

LONGITUDINAL QUARTZ CRYSTAL RESONATOR

This is a Rule 62 continuation application of parent application Ser. No. 199,540 filed May 27, 1988.

BACKGROUND OF THE INVENTION

1. Field of the Invention

The present invention is generally directed to a longitudinal quartz crystal resonator having an intermediate frequency of 1 MHz or thereabouts, and more particularly, to a configuration of the resonator.

2. Prior Arts

In a conventional longitudinal quartz crystal resonator including a vibrational portion and a supporting portion which are integrally formed by an etching method, a frame of the supporting portion is shaped to make its width uniform in the same direction and is mounted at its end portion. Hence, the energy of the vibration portion is transmitted to a mounting portion, which causes vibrational leakage of energy. For this reason, a longitudinal quartz crystal resonator having a low series resistance $R_1$ is not obtained.

In order to cope with this defect, there has heretofore been taken a means that a degree of amplitude of an IC is increased. There arises, however, a problem because the means requires a good deal of consumption of electric current. In the worst case, because a large amount of vibrational leakage(losses caused by a vibration) occurs when placing the resonator in communication equipment and consumer products, the problem arises that the vibration of the resonator halts. The present invention proposes a longitudinal quartz crystal resonator with a remarkably small quantity of vibrational leakage, i.e., the resonator has such a configuration that the losses caused by the vibration become very small.

SUMMARY OF THE INVENTION

An object of the present inventions is to provide a longitudinal quartz crystal resonator with a small series resistance and a high Q-value.

Another object of the present invention is to provide a longitudinal quartz crystal resonator with very small vibrational leakage.

DETAILED DESCRIPTION OF THE PREFERRED EMBODIMENTS

Figure 1A:
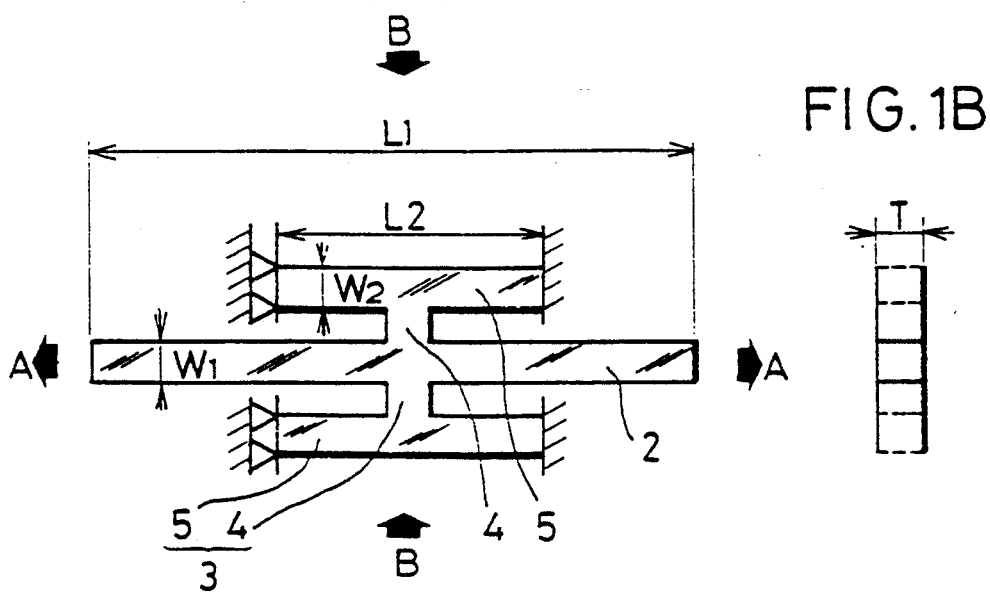
FIGS. 1(A) and (B) are schematic plan and side views each illustrating a principle of a longitudinal quartz crystal resonator according to the present invention.
Figure 1B:
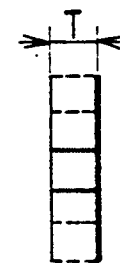

FIG. 1 illustrates a modified shape of the resonator associated with a principle of a longitudinal quartz crystal resonator according to the present invention. In FIG. 1, the resonator consists of a vibrational portion 2 and a supporting portion. The supporting portion 3 is composed of a pair of bridge portions 4 and a pair of flexural portion 5.

It is shown in FIG. 1 that each flexural portion 5 has the boundary conditions that its one end is clamped, while the other end thereof is supported, which means that both displacement and rotational moment is not zero at the one clamped end of the flexural portion, and that displacement is zero but the rotational moment is not zero at the other supported end of the flexural portion. The vibrational portion 2 has a length $L_1$, a width $W_1$ and a thickness T, while each flexural portion 5 has a length $L_2$ and a width $W_2$. When the vibrational portion 2 of the resonator now undergoes, as indicated by arrows A, extensional displacement, it is needless to say that, as indicated by arrows B, a flexural mode inward is created at the flexural portions 5. Inversely, when the vibrational portion 2 compresses, a flexural mode outward is generated at the flexural portions 5. Namely, in accordance with the present invention, the displacement in the width direction of the vibrational portion 2 is converted into the flexural mode of the flexural portions 5, whereby a degree of freedom of the vibration is not restrained. As a matter of fact, there are such dimensions that the vibration is not restrained. The configurational dimensions are determined by the strain energy of the vibrational portion 2. Let us take the strain energy of the vibrational portion 2 to be $U_1$, and the strain energy of the flexural portion to be $U_2$. $U_1$ and $U_2$ are expressed by the following equations.

$$U_1 = \frac{1}{2} \int_{V_1} T_2 S_2 \, dV \qquad (1)$$

$$U_2 = \frac{1}{2} \int_{V_2} EI \left( \frac{\partial^2 v}{\partial x^2} \right)^2 dV \qquad (2)$$

where $T_2$ is the stress, $S_2$ is distortion of the vibrational portion 2, E is Young's modulus, I is the moment of inertia of the flexural portion or strain of the vibrational portion, v is displacement, $V_1$ and $V_2$ are the volumes of the vibrational and flexural portions, respectively, and x is the coordinate of the electrical axis of quartz. In order not to suppress the vibration of the longitudinal quartz crystal resonator, the following relation must be satisfied.

$$U_1 > U_2 \qquad (3)$$

From equations (1), (2) and (3), the dimensions $L_2$ and $W_2$ of the flexural portions 5 are determined. For instance, when the frequency is 1 MHz, and when the dimensions of the vibrational portion are as follows: the length $L_1 = 2.6$ mm, $W_1 = 80$ μm and $T = 160$ μm, a dimensional ratio $W_2/L_2$ of the flexural portions of the supporting portion is 0.16 or less. The dimensions are thus determined. As a result, the longitudinal quartz crystal resonator having a low series resistance and a high Q-value is obtained.

Next, description will be focused on the vibrational leakage. As is obvious from the schematic diagram of FIG. 1, the vibrational energy of the vibrational portion 2 is transmitted via the bridge portions 4 into the flexural portions 5. Accordingly, the object is obtained by minimizing a loss of energy at the flexural portions 5. If the mass of the clamped end of each flexural portion 5 is infinitely large, it follows that the energy of the flexural portion 5 does not leak out. Similarly, it is possible to eliminate the energy leakage by taking the supported end of the flexural portion 5 to be free from a mounting portion 7 having the condition that the other end thereof is clamped. In other words, the object of the present invention is accomplished in the following manner: the vibration of the vibrational portion is made free by selecting a dimension of the flexural portion 5, i.e., the dimensional ratio $W_2/L_2$ of the width $W_2$ to the length $L_2$; and two portions of the flexural portion 5 (clamped portions of the flexural portion 5) connected to a frame portion 6 are made free, and the mass of the same is augmented.

Figure 2:
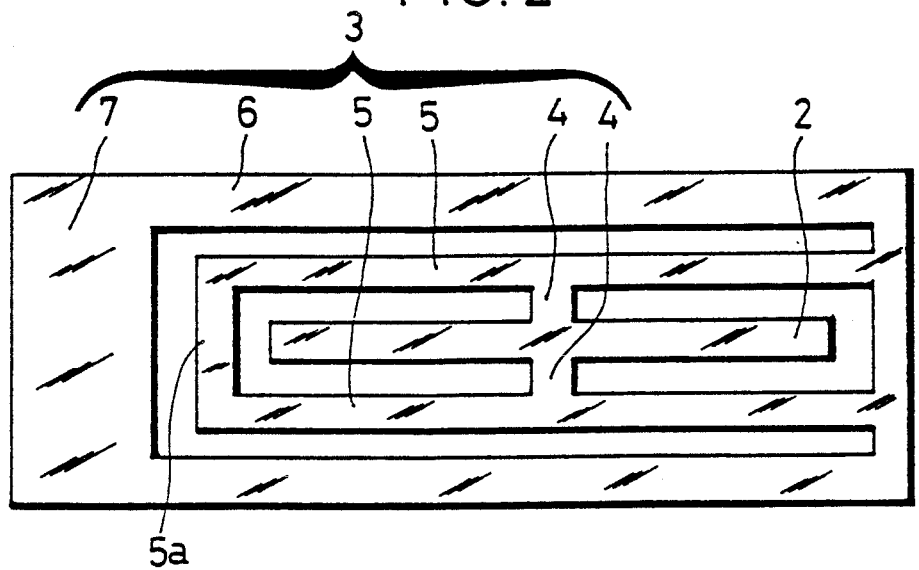
FIG. 2 is a plan view illustrating one embodiment of configurational dimensions of the longitudinal quartz crystal resonator according to the present invention.

Referring to FIG. 2, there is illustrated one embodiment of a longitudinal quartz crystal resonator according to the present invention. A resonator 1 consists of a vibrational portion 2 and a supporting portion 3 which are formed into one united body as an integral one-piece structure by an etching method.

In the first place, the description will be emphasized on the manner in which the restraint of the longitudinal vibration of the vibrational portion 2 is prevented. The vibrational portion 2 is extended and compressed in the longitudinal direction by dint of an applied electric field (not illustrated) from the outside. Simultaneously, the perpendicular direction, viz., in the direction of the bridge portions 4. At this time, it is important that the vibrational portions 2 vibrate in the direction of the bridge portions 4 sufficiently freely in order to cause the vibration of the vibrational portion 2 in the longitudinal direction to be freely excited. In the present invention, it is possible to prevent suppression of the longitudinal vibration of the vibrational portion 2 in accordance with a ratio of the width $W_2$ to the length $L_2$ of the flexural portions 5 of the supporting portion 3, i.e., when $W_2/L_2$ is 0.16 or less and the frequency is 1 MHz.

In the second place, the description will be emphasized on the way in which the longitudinal quartz crystal resonator having no vibrational leakage is obtained. The flexural portions 5 are connected with the vibrational portion 2 via the bridge portions 4. The flexural portions 5, the vibrational 2 and the bridge portions 4 are integrally formed as a one-piece structure by the etching method; and one of the two ends of both flexural portions 5 are connected to the frame 6. In this case, the flexural portions 5 vibrate in at a flexural mode. The flexural portions 5 are arranged such that one of their two ends are connected to the frame 6, while the other of their two ends are interconnected through a transverse section 5a to surround the vibrational portion 2 to vibrate freely. Hence, the flexural portion 5 vibrates under such boundary conditions that one end thereof is clamped, while the other end is supported. If the mass of the frame 6 is extremely augmented, the energy is trapped in the tip ends of the flexural portions 5. As a result, a longitudinal quartz crystal resonator which does not create vibrational leakage in the least is obtained, even if the resonator is mounted at the mounting portion 7.

As described above, the longitudinal quartz crystal resonator incorporated with the vibrational portion and the supporting portion formed by the etching method has the following outstanding effects by proposing a new shape longitudinal quartz crystal resonator.

(1) The series resistance decreases because an improvement of a shape and a dimension for a supporting portion gives a free vibration.

(2) The flexural portions are connected to the frame disposed in the opposite direction to the mounting portion, and the frame has the same effects as those in the case of increasing the mass, resulting in a minimized amount of leakage of vibration; and (3) It is easy to manufacture resonators and possible to miniaturize them because of their one-sided mounting.

We claim:

1. A longitudinal quartz crystal resonator formed as a united body by etching, said resonator comprising:
   a longitudinal vibrational portion;
   a pair of flexural portions which support said vibrational portion, each flexural portion having a longitudinal shape extending parallel to the vibrational portion;
   a transverse connecting portion which interconnects the pair of flexural portions at one of the ends thereof;
   at least two oppositely positioned bridge portions which fasten said flexural portions to said vibrational portion at opposite points on said vibrational portion;
   a frame which surround said flexural portions and which has at one side thereof a transverse beam;
   wherein each flexural portion is connected at the other end thereof directly to the transverse beam and separately from the point of connection of the other flexural portion; and
   wherein the vibrational portion is surrounded by said pair of flexural portions, said transverse connecting portion and said transverse beam.

2. A longitudinal quartz crystal resonator according to claim 1; wherein another side of the frame comprises a mounting portion which is located at the opposite side of the frame to the side of the frame connected to the flexural portions.

* * * * *